United States Patent
Vangal et al.

(10) Patent No.: US 6,597,223 B2
(45) Date of Patent: Jul. 22, 2003

(54) FLIP FLOP CIRCUIT

(75) Inventors: Sriram R. Vangal, Hillsboro, OR (US); Dinesh Somasekhar, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/208,130

(22) Filed: Jul. 30, 2002

(65) Prior Publication Data

US 2002/0175726 A1 Nov. 28, 2002

Related U.S. Application Data

(62) Division of application No. 09/733,216, filed on Dec. 8, 2000, now Pat. No. 6,459,316.

(51) Int. Cl.[7] .............................................. H03K 3/289
(52) U.S. Cl. ...................... 327/202; 327/203; 326/95; 326/96
(58) Field of Search .................. 326/52, 54, 55, 326/93, 95, 96, 97, 98; 327/202, 203, 208–212, 218

(56) References Cited

U.S. PATENT DOCUMENTS

| | | | | |
|---|---|---|---|---|
| 5,117,133 A | * | 5/1992 | Luebs | 326/55 |
| 5,612,632 A | | 3/1997 | Mahant-Shetti et al. | 326/46 |
| 5,764,089 A | | 6/1998 | Partovi et al. | 327/200 |
| 5,867,049 A | * | 2/1999 | Mohd | 327/200 |
| 5,898,330 A | | 4/1999 | Klass | 327/210 |
| 5,900,759 A | | 5/1999 | Tam | 327/201 |
| 6,060,910 A | * | 5/2000 | Inui | 326/98 |
| 6,121,807 A | * | 9/2000 | Klass et al. | 327/218 |
| 6,181,180 B1 | * | 1/2001 | Chen et al. | 327/211 |
| 6,242,952 B1 | | 6/2001 | Bosshart et al. | 326/98 |
| 6,304,123 B1 | | 10/2001 | Bosshart | 327/212 |
| 6,437,602 B1 | * | 8/2002 | Friend et al. | 326/93 |

OTHER PUBLICATIONS

"Power Saving Latch", *IBM Technical Disclosure Bulletin*, 39 (4), (Apr. 1996),pp. 65–66.

Goto, Gensuke., "A 54 X 54–b Regularly Structured Tree Multiplier", *IEEE Journal of Solid–State Circuits, vol. 27*, (Sep. 1992), 1229–1236.

Klass, Fabian., "Semi–Dynamic and Dynamic Flip–Flops with Embedded Logic", *Proceedings of the Symposium on VLSI Circuits, Digest of Technical Papers*, Honolulu, HI, IEEE Circuits Soc. Japan Soc. Appl. Phys. Inst. Electron., Inf., (1998),pp. 108–109.

Partovi, Hamid., "Flow–Through Latch and Edge–Triggered Flip–Flop Hybrid Elements", *Proceedings of the IEEE International Solid–State Circuits Conference, Digest of Technical Papers and Slide Supplement*, NexGen Inc., Milpitas, CA, (1996), 40 pgs.

* cited by examiner

*Primary Examiner*—Tuan T. Lam
(74) *Attorney, Agent, or Firm*—Schwegman, Lundberg, Woessner & Kluth, P.A.

(57) ABSTRACT

A dual rail flip flop with complementary outputs includes a master stage with embedded logic, a sensing stage, and one or more slave stages. The flip flop operates in a pre-charge state and an evaluate state. During the pre-charge state when a clock signal is low, the flip flop pre-charges internal keeper nodes to a high value. When the clock signal transitions high, the flip flop enters an evaluation state and one of the internal keeper nodes evaluates to a low value. The sense stage senses which of the internal keeper nodes is evaluating to zero, and drives it to zero faster. The slave stages reflect the state of the internal keeper nodes during the evaluate state, and maintain their states during the pre-charge state.

16 Claims, 5 Drawing Sheets

FLIP FLOP CIRCUIT

This application is a divisional of application U.S. Ser. No. 09/733,216 now U.S. Pat. No. 6,459,316 filed on Dec. 8, 2000.

FIELD

The present invention relates generally to flip flop circuits, and more specifically to fast semi-dynamic flip flop circuits.

BACKGROUND

Flip flop circuits have a wide variety of uses in today's computers and digital circuits. Flip-flops are one of the most common elements used to implement sequential circuits, in which the primary output relies not only on the current values of the input, but also the previous input values. Flip flop circuits are used to generate a steady state output signal having either a high (logical one) or a low (logical zero) potential, and some flip flop circuits generate complementary output signals having opposite potentials.

Semi-dynamic flip flops are flip flop circuits having a dynamic master stage and a static slave stage. Examples of semi-dynamic flip flop circuits are described in U.S. Pat. Nos. 5,898,330, issued 04/27/99 and 5,900,759, issued May 4, 1999. Designers are constantly striving to improve flip flop circuits, in part because of the widespread use of flip flop circuits in integrated circuits.

For the reasons stated above, and for other reasons stated below which will become apparent to those skilled in the art upon reading and understanding the present specification, there is a need in the art for improved flip flop circuits.

DESCRIPTION OF EMBODIMENTS

Figure 1:
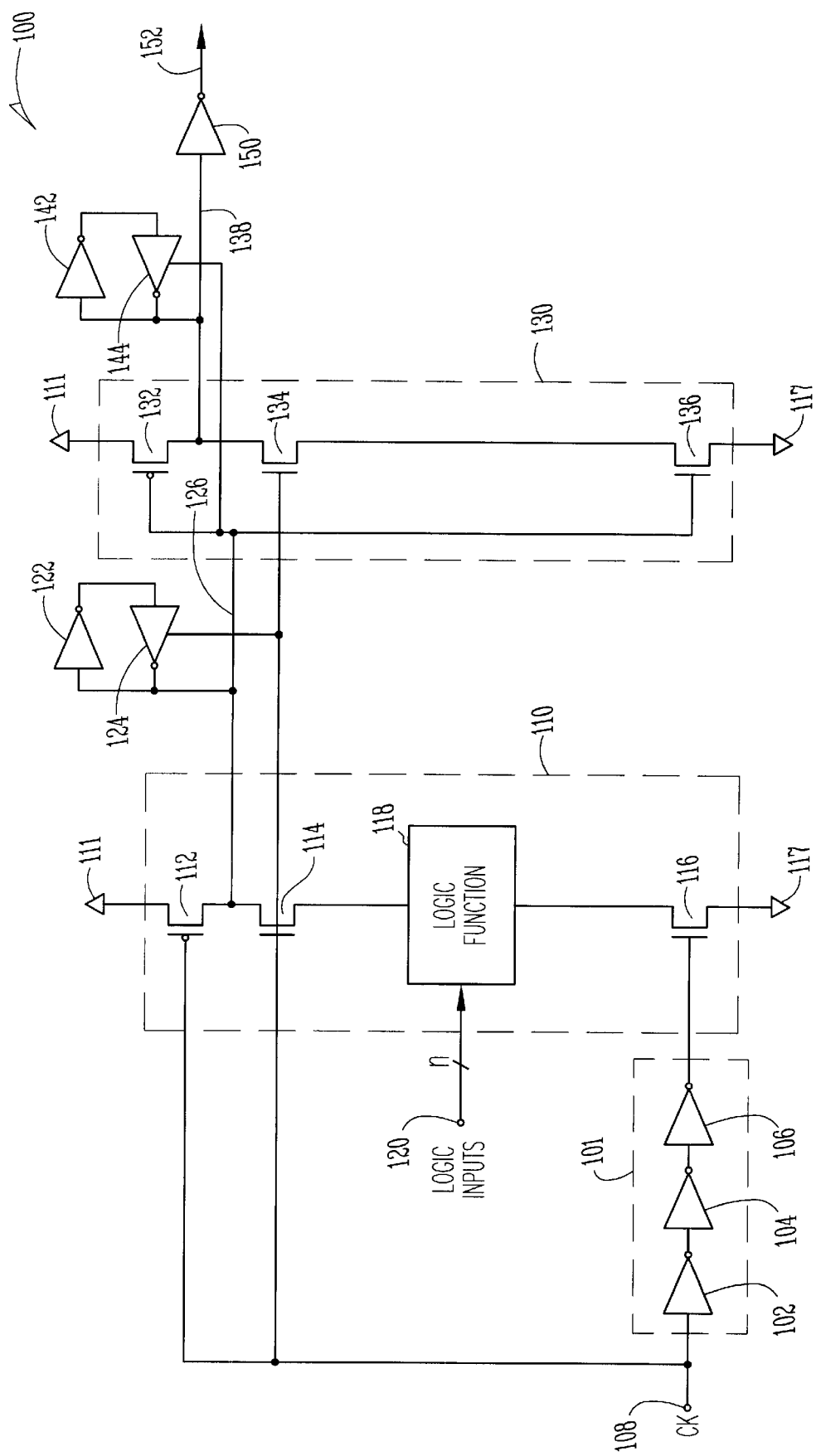
FIG. 1 shows a flip flop circuit with an embedded logic function.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to include embedded logic functions in flip flop circuits. A dual rail flip flop with complementary outputs includes a master stage with embedded logic, a sensing stage, and one or more slave stages. The flip flop operates in a pre-charge state and an evaluate state. During the pre-charge state when a clock signal is low, the flip flop pre-charges internal keeper nodes to a high value. When the clock signal transitions high, the flip flop enters an evaluation state and one of the internal keeper nodes evaluates to a low value. The sense stage senses which of the internal keeper nodes is evaluating to zero, and drives it to zero faster. The slave stages reflect the state of the internal keeper nodes during the evaluate state, and maintain their states during the pre-charge state.

FIG. 1 shows a flip flop circuit with an embedded logic function. Flip flop circuit 100 includes master stage 110, slave stage 130, clock inverting stage 101, and inverters 122, 124, 142, 144, and 150. Master stage 110 includes transistors 112, 114, and 116, and logic function 118 connected in series between an upper voltage supply node 111, and a lower voltage supply node 117. Slave stage 130 includes transistors 132, 134, and 136 coupled in series between nodes 111 and 117. Clock inverting stage 101 includes series connected inverters 102, 104, and 106, and drives the gate of transistor 116. Inverters 122 and 124 are cross-coupled to form a latch, as are inverters 142 and 144. Inverters 124 and 144 are "clocked inverters," each having a control input node. The behavior of inverters 124 and 144 depends on the state of the signal present on the corresponding control input node. Inverter 150 is coupled in series with the output of flip flop 100 to serve as a buffer. In some embodiments, inverter 150 is omitted.

Clock signal CK is coupled to a clock input node 108, which is connected to the gates of transistors 112, 114, and 134, inverter 102, and the control input of clocked inverter 124. Series connected inverters 102, 104, and 106 are connected in series between node 108 and the gate of transistor 116, which receives an inverted and delayed version of the clock signal CK. Logic function 118 receives input data on logic input nodes 120, and is coupled in series between transistor 114 and 116. Node 126 is defined at the connection between transistors 112 and 114. Node 126 is connected to the gates of transistors 132 and 136, and to the control input of clocked inverter 144.

Flip flop circuit 100 includes two latches: one formed by the combination of cross-coupled inverters 122 and 124, and another formed by the combination of cross-coupled inverters 142 and 144. Each of the latches includes an inverter cross-coupled with a clocked inverter. For example, inverter 122 is cross-coupled with clocked inverter 124, and inverter 142 is cross-coupled with clocked inverter 144. When a signal on the control input node of a clocked inverter is at a logic one, the clocked inverter operates as a normal inverter. When operating as a normal inverter, a clocked inverter produces a high output for a low input, and produces a low output for a high input. When a signal on the control input node of a clocked inverter is at a logic zero, the clocked inverter does not drive the output low for a high input. In these embodiments, when a high signal is on the control input of the clocked inverter, the latch will retain its value even if decoupled from the remainder of the circuit, since the cross-coupled inverters create a loop that holds the present value at the input to both of the cross-coupled inverters. Specific implementation embodiments of clocked inverters are presented in the figures following FIG. 1.

Various embodiments of circuits are described with reference to circuit nodes having logical states of logical "1" or logical "0." Circuit nodes are also described as having high voltage and low voltage signals applied thereto. The terms logical "1" and logical "0" generally correspond to a high voltage and a low voltage, respectively. The "logical" terms are used when describing the logical operation of a circuit, and the "voltage" terms are generally used when describing the circuit more fully. One skilled in the art will understand that a logical inversion can take place while still practicing the present invention. A logical inversion would exist if the terms logical "1" and logical "0" corresponded to a low voltage and a high voltage, respectively.

Transistors 112 and 132, in the embodiment of FIG. 1, are p-type transistor switches which are closed (on) between their source and drain when their gate is at a low potential, and which are open (off) between their source and drain when their gate is at a high potential. Transistors 114, 116, 134, and 136, in the embodiment of FIG. 1, are n-type transistor switches which are closed (on) between their source and drain when their gate is at a high potential, and which are open (off) between their source and drain when their gate is at a low potential.

In operation, as the clock signal transitions between a logical one and a logical zero, flip flop 100 repeatedly transitions back and forth between two states: a pre-charge state, and an evaluate state. In the pre-charge state, achieved when clock signal CK is in a low state and has been in a low state for a sufficient period of time for all outputs and internal nodes to stabilize at a steady state level, transistors 112 and 116 are on, and transistors 114 and 134 are off. In this pre-charge state, internal node 126 is "pre-charged" to a high potential through transistor 112. Transistor 112 is referred to as a pre-charge transistor.

In the pre-charge state, node 126 is high, and transistor 132 is off. The control input node of clocked inverter 144 is coupled to node 126, and so is also high in the pre-charge state. Because transistors 132 and 134 are both off, node 138 is decoupled from power supply nodes 111 and 117. Due to the operation of inverters 142 and 144, the previous value on node 138 is maintained. For example, if in a previous evaluate state (discussed below), node 138 is driven low, then node 138 remains low during the subsequent pre-charge state.

Logic function 118 within master stage 110 conditionally couples transistors 114 and 116. For example, when the logic inputs on node 120 satisfy a particular logic function, then logic function 118 is closed and provides a current path from transistor 114 to transistor 116. For all other combinations of logic inputs, logic function 118 is open and no current path exists. In the pre-charge state, transistor 116 is on, and transistor 114 is off. As a result, regardless of the value of logic inputs 120, node 126 is not coupled to lower supply node 117 during the pre-charge state.

On the rising edge of clock CK, flip flop circuit 100 enters the evaluate state. Transistor 112 turns off, and transistor 114 turns on. Transistor 116 remains on for the delay period of the clock inverting stage that includes the three inverters 102, 104, and 106, and then shuts off. As a result, transistors 114 and 116 are both on for the delay period of clock inverting stage 101. If the logic inputs on node 120 satisfy logic function 118, node 126 is discharged to logic zero through transistors 114, 116, and logic function 118. Node 126 is said to "evaluate" to zero, and transistors 114 and 116 are referred to as "evaluation" transistors.

When node 126 evaluates to logic zero, the gates of transistors 132 and 136 are pulled to logic zero. When this occurs, transistor 132 turns on, and transistor 136 turns off. This holds output node 138 at logic high (if the previous value was high), or pulls output node 138 to logic high through transistor 132. Node 126 retains its low value due to cross-coupled inverters 122 and 124. Cross-coupled inverters 122 and 124 form a "keeper" latch, and node 126 is termed a "keeper" node. When the clock signal CK on node 108 transitions high, clocked inverter 124 has a high signal on its control input node, thereby once again allowing it to drive a low voltage on node 126. When node 126 evaluates to a zero, then clocked inverter 144 no longer drives node 138 low, thereby allowing transistor 132 to more quickly and easily pull node 138 high.

If on the rising clock edge, logic inputs 120 do not satisfy logic function 118, transistor 114 still turns on, and transistor 112 still turns off. However, internal node 126 will remain at logic high since the discharge path to lower power supply node 117 is shut off by logic function 118. Transistor 136 will remain on, transistor 132 will remain off, and output node 138 will either hold at logic zero, or be discharged to logic zero through transistors 134 and 136. Cross-coupled inverters 122 and 124 allow internal node 126 to maintain its value upon the rising edge of the clock CK when logic inputs 120 do not satisfy logic function 118.

During the evaluate state, the clock signal CK is high, and node 126 maintains the state (either low or high) to which it evaluated. When CK transitions back to low, the flip flop transitions back to the pre-charge state. Transistor 112 turns on and node 126 is "pre-charged" back high. During this transition, clocked inverter 124 no longer drives node 126 to zero because of the state of the CK signal on the control input. As a result, transistor 112 can pull node 126 high without having to overcome the drive strength of inverter 124.

Logic function 118 can be any type of logic function. For example, in some embodiments, two logic inputs 120 drive gates of series connected n-channel transistors, forming an "and" gate. In other embodiments, two logic inputs 120 drive gates of parallel connected n-channel transistors, forming an "or" gate. Any type of logic function can be implemented without departing from the scope of the present invention.

Master stage 110 is referred to as a "dynamic" master stage, in part because the output node of master stage 110, node 126, returns to a pre-charge state on every clock cycle. Slave stage 130 is referred to as a "static" slave stage, in part because output node 138 of slave stage 130 remains static during each clock cycle. The combination of the dynamic master stage and static slave stage is referred to as a "semi-dynamic" flip flop circuit.

Figure 2:
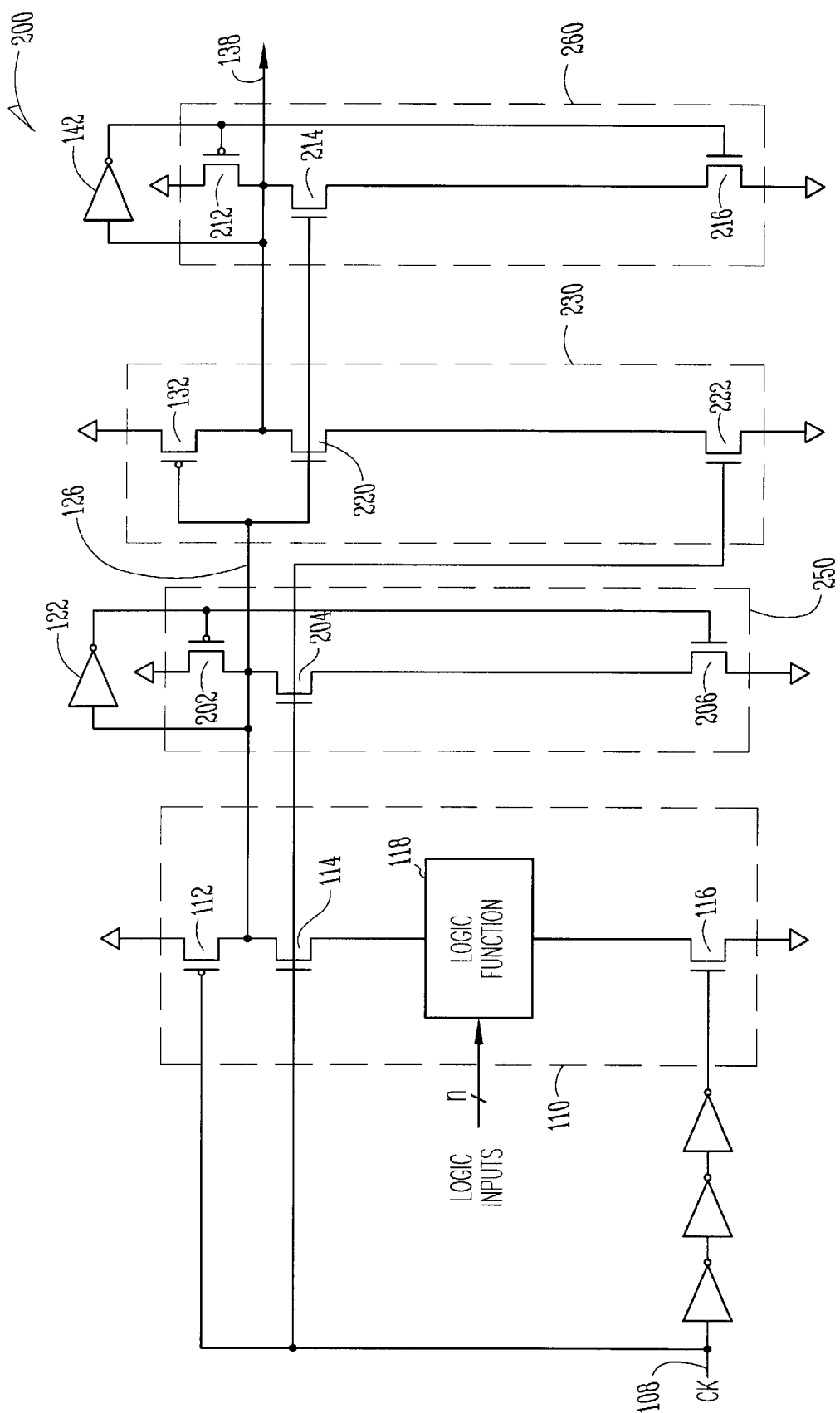
FIG. 2 shows a flip flop circuit with clocked inverters.

FIG. 2 shows a flip flop circuit with clocked inverters. Flip flop circuit 200 includes master stage 110, slave stage 230, inverters 122 and 142, and clocked inverters 250 and 260. Master stage 110 is the same as that shown in FIG. 1. Slave stage 230 of FIG. 2 differs from slave stage 130 of FIG. 1. Slave stage 230 includes p-channel transistor 132 and n-channel transistor 220 having gates coupled to node 126. Slave stage 230 also includes n-channel transistor 222 having a gate driven by the clock signal CK. One difference between slave stage 230 (FIG. 2) and slave stage 130 (FIG. 1) is the order in which the n-channel transistors are connected between the lower power supply node and p-channel transistor 132.

The structure of slave stage 230 can reduce output glitches caused by charge sharing between transistors 220 and 222 when the clock signal CK transitions high. For example, transistor 134 (FIG. 1) turns on when the clock signal CK transitions high. As a result, the circuit node between transistors 134 and 136 charges with charge from output node 138, causing a slight negative glitch on the output node. When transistor 222 (FIG. 2) turns on, this negative glitch does not occur.

Clocked inverter 250 includes pullup transistor 202, pulldown transistor 206, and clocked transistor 204. When a signal on the gate of clocked transistor 204 is low, clocked inverter 250 cannot drive node 126 low. In the embodiment of FIG. 2, the gate of transistor 204 is coupled to node 108, which has the clock signal CK imposed thereon. Therefore, when the clock signal CK is low, clocked inverter 250 cannot drive node 126 low. Clocked inverter 260 includes pullup transistor 212, pulldown transistor 216, and clocked transistor 214. When a signal on node 126 is low, clocked inverter 260 cannot drive node 138 low, because node 126 is coupled to the gate of transistor 214.

Flip flop circuit 200 does not include a buffer on the output such as inverter 150 (FIG. 1). This can be useful when flip flop 200 drives a light load, in part because the delay of buffer 150 is not incurred by the output signal.

Figure 3:
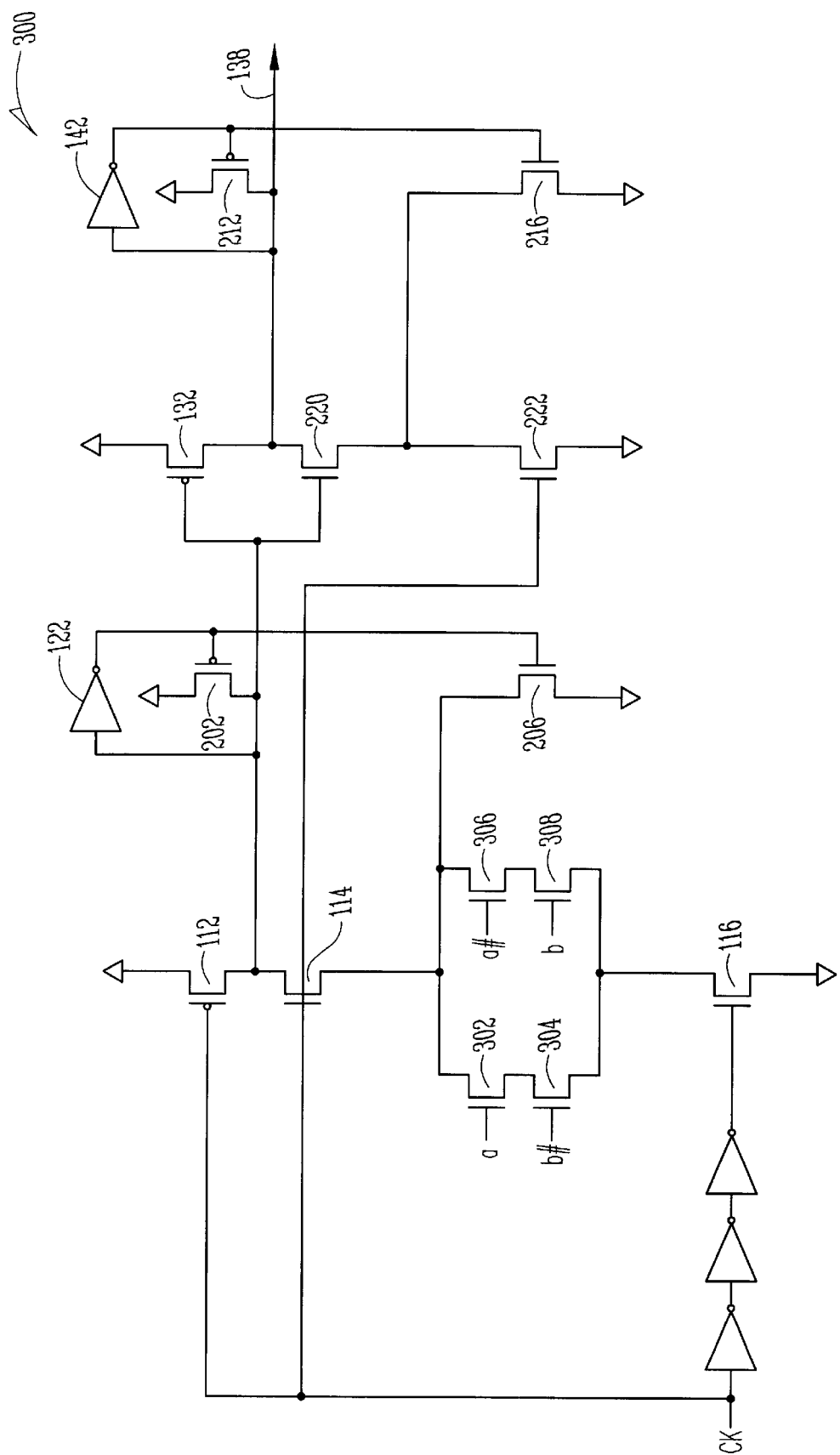
FIG. 3 shows a flip flop circuit with clocked inverters having shared transistors.

FIG. 3 shows a flip flop circuit with clocked inverters having shared transistors. Flip flop 300 includes a master stage that includes transistors 112, 114, and 116, and a logic function that includes n-channel transistors 302, 304, 306, and 308. Each of n-channel transistors 302, 304, 306, and 308 has a gate coupled to a logic input. For example, transistors 302 and 306 have gates coupled to complementary inputs labeled "a" and "a#," respectively, and transistors 304 and 308 have gates coupled to complementary inputs labeled "b#" and "b," respectively. The four n-channel transistors of the logic function are arranged to implement an exclusive-or function. When logic inputs "a" and "b#" are both asserted or when logic inputs "a#" and "b" are both asserted, a current path exists between transistors 114 and 116 when the evaluate state is entered and both evaluation transistors 114 and 116 are on. The evaluate state is more fully described above with reference to FIG. 1.

In the embodiment of FIG. 3, the logic function is implemented in a stack of n-channel transistors. As shown in FIG. 3, two parallel stacks of series connected transistors implement an exclusive-or logic function. Any combination of parallel and series transistors is possible, thereby implementing any logic function. In the embodiment shown, the transistors in the stack are n-channel transistors. In other embodiments, the transistor stack is coupled in series between keeper node 126 and transistor 114, and the stack includes p-channel transistors.

Pullup transistor 202 and pulldown transistor 206 are part of a clocked inverter that includes n-channel transistor 114 of the master stage. Transistor 114 is shared between the master stage and the clocked inverter that is cross-coupled with inverter 122. Within the master stage, transistor 114 is an evaluation transistor, and within the clocked inverter, transistor 114 is a clocked transistor. Likewise, pullup transistor 212 and pulldown transistor 216 are part of a clocked inverter that includes n-channel transistor 220. Transistor 220 is shared between the slave stage and the clocked inverter that is cross-coupled with inverter 142. Within the slave stage, transistor 220 is part of a complementary pair driven by the keeper node, and within the clocked inverter, transistor 220 is a clocked transistor.

Figure 4:
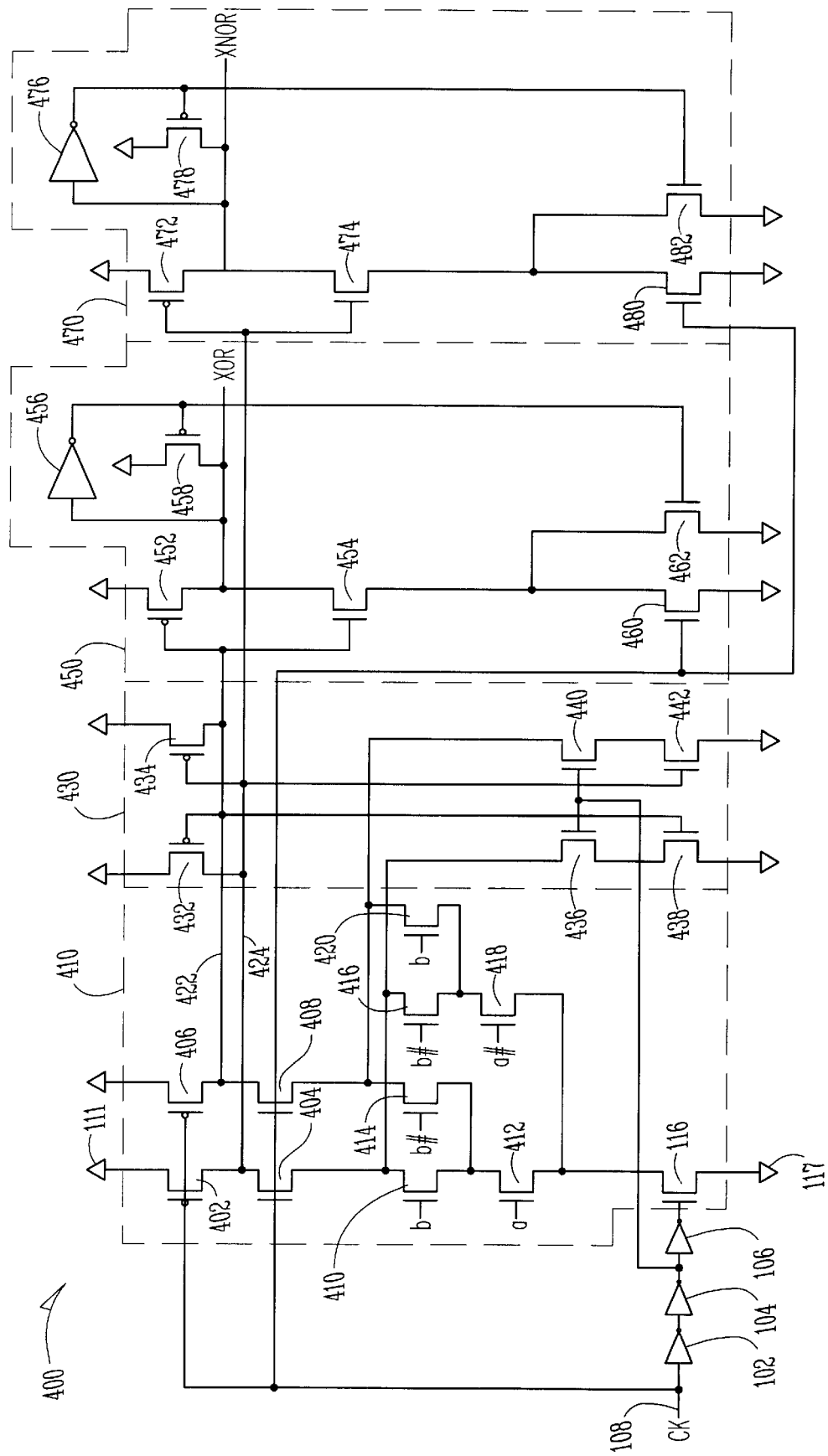
FIG. 4 shows a dual rail flip flop with an embedded logic function.

FIG. 4 shows a dual rail flip flop with an embedded logic function. Flip flop circuit 400 includes master stage 410, sense stage 430, and slave stages 450 and 470. Like master stages of previous figures, master stage 410 accepts a clock signal on node 108, and accepts logic inputs to a logic function. Unlike master stages of previous figures, master stage 410 drives two keeper nodes 422 and 424 instead of one. Both keeper nodes 422 and 424 are pre-charged to a high state, but during evaluation, are driven to opposite states by virtue of complementary logic functions.

The complementary logic functions of flip flop circuit 400 are implemented by a stack of n-channel transistors that includes transistors 410, 412, 414, 416, 418, and 420. During evaluation, node 422 evaluates to a zero if the exclusive-or of "a" and "b" is satisfied, and node 424 evaluates to zero if the exclusive-nor of "a" and "b" is satisfied. Any complementary logic functions can be utilized without departing from the scope of the present invention. For example, "or" and "nor," "and" and "nand," or any other arbitrary pair of complementary logic functions can be used.

Within master stage 410, pre-charge transistor 402 and evaluation transistor 404 form a complementary pair of transistors that drive keeper node 424. Likewise, pre-charge transistor 406 and evaluation transistor 408 form a complementary pair of transistors that drive keeper node 422. Each of the complementary transistor pairs corresponds to one of the complementary logic functions described above. For example, complementary pair of transistors 402 and 404 correspond to the exclusive-nor of "a" and "b," and complementary pair of transistors 406 and 408 correspond to the exclusive-or of "a" and "b." In the embodiment of FIG. 4, both logic functions are coupled to evaluation transistor 116. In other embodiments, each logic function has a dedicated evaluation transistor coupling it to the lower supply node.

Sense stage 430 includes pullup transistors 432 and 434, clocked transistors 436 and 440, and pulldown transistors 438 and 442. Sense stage 430 also shares evaluation transistors 408 and 404 with master stage 410. Pullup transistor 432 and pulldown transistor 438 form a clocked inverter with evaluation transistor 404 and clocked transistor 436 coupled in series between them. Likewise, pullup transistor 434 and pulldown transistor 442 form an clocked inverter with evaluation transistor 408 and clocked transistor 440 between them.

The two clocked inverters in sense stage 430 are not enabled during the pre-charge state. For example, during the pre-charge state, both keeper nodes 422 and 424 are pre-charged high and pullup transistors 432 and 434 are off. The clock signal CK is low and transistors 404, 408, 436, and 440 are also off. As a result, during the pre-charge state, sense stage 430 does not influence the state of keeper nodes 422 and 424.

During the evaluation state, sense stage 430 senses the state to which each of keeper nodes 422 and 424 is evaluating, and then drives the keeper nodes further into those states. For example, when the clock signal CK transitions high, evaluation transistors 404 and 408 turn on and one of keeper nodes 422 and 424 begins to evaluate to zero. This analysis assumes stable data input values at the logic function in the stack of n-channel transistors. After the delay time of inverters 102 and 104, clocked transistors 436 and 440 turn on, and the clocked inverters in sense stage 430 begin to operate. One of keeper nodes 422 and 424 is still high and the other is evaluating to zero. The keeper node that is high drives one of the inverters in sense stage 430 and causes the other keeper node to evaluate to zero more quickly. For example, assuming that the logic function causes keeper node 424 to evaluate to zero and keeper node 422 to remain pre-charged, when clocked transistors 436 and 440 turn on, the inverter formed by pullup transistor 432 and pulldown transistor 438 drives keeper node 424 to zero faster.

Clocked transistors 436 and 440 are driven by a non-inverted, delayed clock signal. The delayed clock provides "sensing" of the evaluated states of the keeper nodes and causes them to reach their final evaluated state faster. Once the evaluation state is fully entered, and steady state is reached with the clock signal CK low, sense stage 430 includes cross-coupled inverters that form a latch between complementary keeper nodes 422 and 424. It is not necessary to drive the gates of clocked transistors 436 and 440 with the delayed clock signal as shown in FIG. 4. Any signal that turns on clocked transistors 436 and 440 at an appropriate point in the evaluation can be utilized without departing from the scope of the present invention.

In the embodiment of FIG. 4, slave stages 450 and 470 are the same as the slave stage of FIG. 3. Slave stage 450 includes pullup transistor 452, pulldown transistor 454, and clocked transistor 460. A latch on the output of slave stage 450 includes forward inverter 456 cross-coupled with a clocked feedback inverter that includes pullup transistor 458, pulldown transistor 462, and shared transistor 454. The output of slave stage 450 is the exclusive-or "XOR" of the logic inputs to master stage 410.

Slave stage 470 includes pullup transistor 472, pulldown transistor 474, and clocked transistor 480. A latch on the output of slave stage 470 includes forward inverter 476 cross-coupled with a clocked feedback inverter that includes pullup transistor 478, pulldown transistor 482, and shared transistor 474. The output of slave stage 470 is the exclusive-nor "XNOR" of the logic inputs to master stage 410.

Flip flop circuit 400 is referred to as a "dual rail" flip flop because it produces complementary outputs. The complementary outputs and the embedded logic functions allow the fast generation of complementary flip flop output signals.

Figure 5:
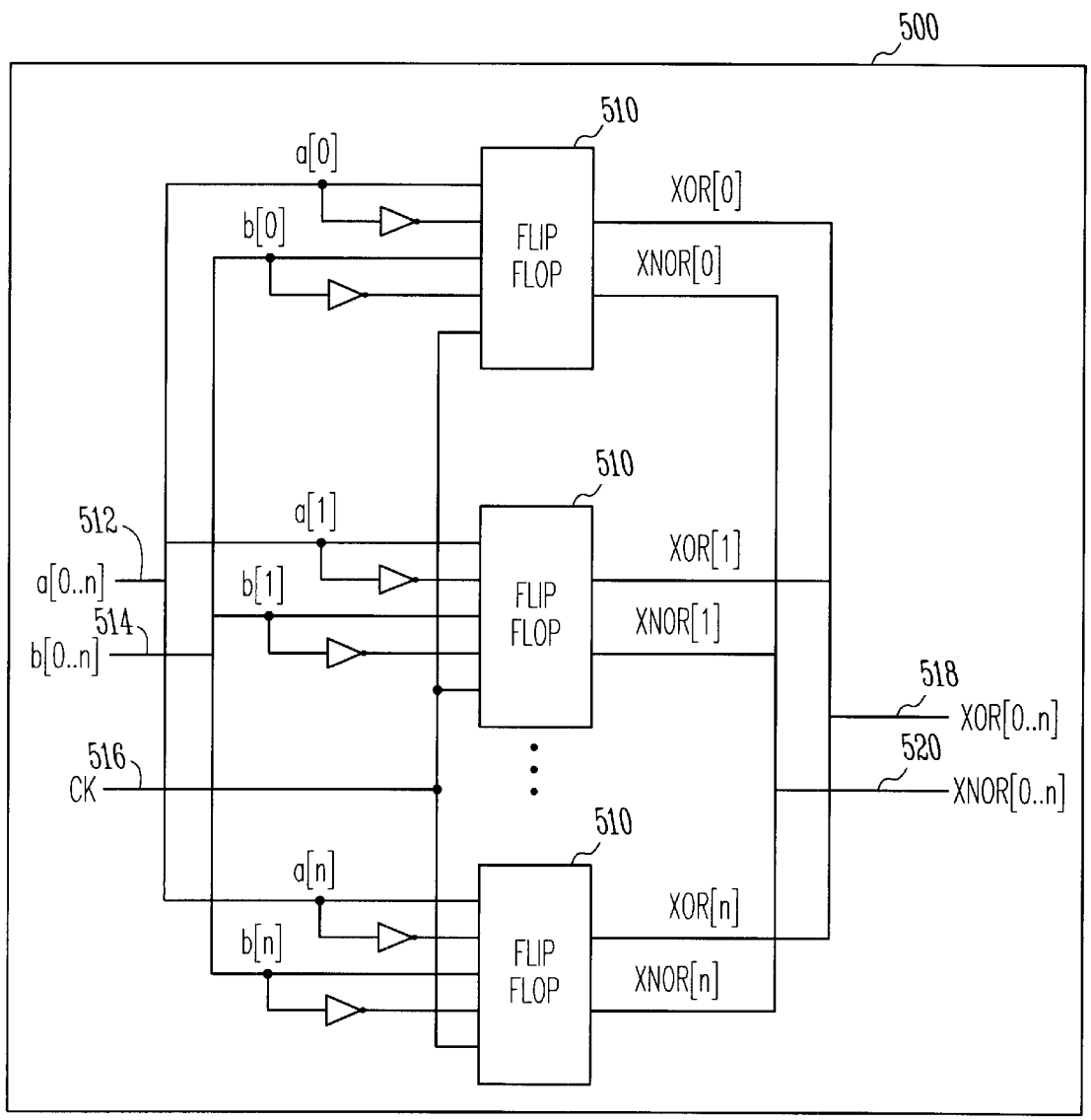
FIG. 5 shows an integrated circuit.

FIG. 5 shows an integrated circuit. Integrated circuit 500 includes flip flops 510 that each receive logic inputs from data buses 512 and 514. In the embodiment of FIG. 5, data bus 512 includes "n+1" signals labeled a[0 . . . n], and data bus 514 includes "n+1" signals labeled b[0 . . . n]. Flip flops 510 also receive clock signal CK on node 516.

Flip flops 510 can be any flip flop embodiment of the present invention, including those with embedded logic functions shown in the previous figures. In the example embodiment shown in FIG. 5, flip flops 510 are dual rail flip flops that implement an exclusive-or and exclusive-nor combination of logic functions, and produce output signals on nodes 518 and 520. Output node 518 is the exclusive-or output, and is labeled XOR [0 . . . n]. Output node 520 is the exclusive-nor output, and is labeled XNOR[0 . . . n].

Integrated circuit 500 can be any type of integrated circuit capable of including flip flop 510. For example, integrated circuit 500 can be a processor such as a microprocessor, a digital signal processor, a micro controller, or the like. Integrated circuit 500 can also be an integrated circuit other than a processor such as an application-specific integrated circuit (ASIC), a communications device, a memory controller, or a memory such as a dynamic random access memory (DRAM).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed:

1. A dual-rail flip flop circuit comprising:
a master stage that includes a transistor stack to implement complementary logic functions to drive first and second complementary keeper nodes;
a sense stage coupled to the first and second complementary keeper nodes; and
a slave stage responsive to the first and second complementary keeper nodes to produce complementary flip flop outputs,
wherein the transistor stack comprises:
first n-channel transistors to implement a first logic function; and
second n-channel transistors to implement a second logic function, the second
logic function being the logical complement of the first logic function.

2. The dual-rail flip flop circuit of claim 1 wherein the transistor stack further comprises:
a first complementary transistor pair coupled in series between an upper power supply node and the first n-channel transistors; and
a second complementary transistor pair coupled in series between the upper power supply node and the second n-channel transistors.

3. The dual-rail flip flop circuit of claim 1 wherein the master stage further comprises:
a clock input node to receive a clock signal;
a clock inverting stage coupled between the clock input node and an inverse clock node, the clock inverting stage to produce a delayed inverted clock signal on the inverse clock node; and
an evaluation transistor coupled between both the first and second n-channel transistors and a lower power supply node, the evaluation transistor having a gate coupled to the inverse clock node.

4. The dual-rail flip flop circuit of claim 3 wherein gates of the first complementary transistor pair and the second complementary transistor pair are coupled to the clock input node.

5. A dual-rail flip flop circuit comprising:
a master stage that includes a transistor stack to implement complementary logic functions to drive first and second complementary keeper nodes;
a sense stage coupled to the first and second complementary keeper nodes; and
a slave stage responsive to the first and second complementary keeper nodes to produce complementary flip flop outputs,
wherein the sense stage comprises:
a first pullup transistor responsive to the first complementary keeper node to conditionally pull up the second complementary keeper node; and
a second pullup transistor responsive to the second complementary keeper node to conditionally pull up the first complementary keeper node.

6. The dual-rail flip flop circuit of claim 5 wherein the sense stage further comprises first and second series connected pulldown transistors coupled between a first of the complementary logic functions and a lower power supply node, the first series connected pulldown transistor having a gate coupled to a delayed clock node, and the second series connected pulldown transistor having a gate coupled to the first complementary keeper node.

7. The dual-rail flip flop circuit of claim 6 wherein the sense stage further comprises third and fourth series connected pulldown transistors coupled between a second of the complementary logic functions and the lower power supply node, the third series connected pulldown transistor having a gate coupled to the delayed clock node, and the fourth series connected pulldown transistor having a gate coupled to the second complementary keeper node.

8. A dual-rail flip flop circuit comprising:
a master stage that includes a transistor stack to implement complementary logic functions to drive first and second complementary keeper nodes;
a sense stage coupled to the first and second complementary keeper nodes; and
a slave stage responsive to the first and second complementary keeper nodes to produce complementary flip flop outputs,
wherein the slave stage comprises:
a first circuit responsive to the first complementary keeper node; and
a second circuit responsive to the second complementary keeper node,
wherein the first circuit comprises:
a first complementary transistor pair having gates coupled to the first complementary keeper node;
an output node created at a junction between the first complementary transistor pair; and
a clocked transistor coupled between the first complementary transistor pair and a lower power supply node.

9. The dual-rail flip flop circuit of claim 8 wherein the first circuit further comprises:
a forward inverter having an input node coupled to the output node created at the junction between the first complementary transistors; and
a pullup transistor coupled between the upper power supply node and the output node.

10. The dual-rail flip flop circuit of claim 9 further comprising a buffer coupled between the output node created at the junction between the first complementary transistors and an output node of the dual-rail flip flop.

11. The dual-rail flip flop circuit of claim 9 wherein the first circuit further comprises a pulldown transistor responsive to the forward inverter, the pulldown transistor being coupled between the lower power supply node and a junction formed between the first complementary transistors and the clocked transistor.

12. An integrated circuit that includes a data path having at least one flip flop, the at least one flip flop comprising:
a master stage that includes a transistor stack to implement a logic function, and to produce complementary voltages on complementary keeper nodes;
a sense stage to sense the complementary voltages on the complementary keeper nodes; and
a slave stage responsive to the complementary keeper nodes to drive complementary flip flop outputs,
wherein the master stage comprises:
a first and second transistor stacks to implement complementary logic functions;
a first complementary transistor pair coupled in series between an upper power supply node and the first transistor stack; and
a second complementary transistor pair coupled in series between the upper power supply node and the second transistor stack.

13. The integrated circuit of claim 12 wherein the integrated circuit comprises a processor.

14. An integrated circuit that includes a data path having at least one flip flop, the at least one flip flop comprising:
a master stage that includes a transistor stack to implement a logic function, and to produce complementary voltages on complementary keeper nodes;
a sense stage to sense the complementary voltages on the complementary keeper nodes; and
a slave stage responsive to the complementary keeper nodes to drive complementary flip flop outputs.
wherein the sense stage comprises:
a first pullup transistor responsive to a first complementary keeper node of the complementary keeper nodes to conditionally pull up a second complementary keeper node of the complementary keeper nodes; and
a second pullup transistor responsive to the second complementary keeper node to conditionally pull up the first complementary keeper node.

15. The integrated circuit of claim 14 wherein the sense stage further comprises first and second series connected pulldown transistors coupled between the transistor stack and a lower power supply node, the first series connected pulldown transistor having a gate coupled to a delayed clock node, and the second series connected pulldown transistor having a gate coupled to the first complementary keeper node.

16. An integrated circuit that includes a data path having at least one flip flop, the at least one flip flop comprising:
a master stage that includes a transistor stack to implement a logic function, and to produce complementary voltages on complementary keeper nodes;
a sense stage to sense the complementary voltages on the complementary keeper nodes; and,
a slave stage responsive to the complementary keeper nodes to drive complementary flip flop outputs,
wherein the slave stage comprises:
a first circuit responsive to a first complementary keeper node of the complementary keeper nodes; and
a second circuit responsive to a second complementary keeper node of the complementary keeper nodes,
wherein the first circuit comprises:
a first complementary transistor pair having gates coupled to the first complementary keeper node;
an output node created at a junction between the first complementary transistor pair; and
a clocked transistor coupled between the first complementary transistor pair and a lower power supply node.

* * * * *

UNITED STATES PATENT AND TRADEMARK OFFICE
CERTIFICATE OF CORRECTION

PATENT NO.      : 6,597,223 B2
DATED           : July 22, 2003
INVENTOR(S)     : Sriram R. Vangal and Dinesh Somasekhar It is certified that error appears in the above-identified patent and that said Letters Patent is hereby corrected as shown below:

<u>Title page,</u>
Item [56], References Cited, OTHER PUBLICATIONS, insert the following:

-- FOREIGN PATENT DOCUMENTS

JP      01206717      08/1989 ......................... H03K/003/037 --

Signed and Sealed this

Twenty-third Day of December, 2003

JAMES E. ROGAN
*Director of the United States Patent and Trademark Office*